(12) United States Patent
Schmollngruber et al.

(10) Patent No.: US 7,312,609 B2
(45) Date of Patent: Dec. 25, 2007

(54) GMR SENSOR ELEMENT AND ITS USE

(75) Inventors: Peter Schmollngruber, Aidlingen (DE); Ingo Herrmann, Leinfelden-Echterdingen (DE); Henrik Siegle, Leonberg (DE); Hartmut Kittel, Weissach-Flacht (DE); Paul Farber, Stuttgart (DE); Ulrich May, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/523,252

(22) PCT Filed: Jun. 27, 2003

(86) PCT No.: PCT/DE03/02145

§ 371 (c)(1),
(2), (4) Date: Oct. 6, 2005

(87) PCT Pub. No.: WO2004/017086

PCT Pub. Date: Feb. 26, 2004

(65) Prior Publication Data

US 2006/0103381 A1 May 18, 2006

(30) Foreign Application Priority Data

Jul. 26, 2002 (DE) .............................. 102 34 347
Dec. 7, 2002 (DE) .............................. 102 57 253

(51) Int. Cl.
G01R 33/09 (2006.01)
G01R 33/02 (2006.01)
G01B 7/30 (2006.01)

(52) U.S. Cl. ................. 324/252; 324/249; 324/207.25; 324/207.21

(58) Field of Classification Search ................ 324/252, 324/207.21, 207.25, 249; 338/32 R, 32 H; 73/514.16, 514.31, 514.39; 123/612, 617
See application file for complete search history.

(56) References Cited

U.S. PATENT DOCUMENTS

| 5,602,471 | A | * | 2/1997 | Muth et al. ............ 324/207.21 |
| 6,100,686 | A | * | 8/2000 | Van Delden et al. ....... 324/252 |
| 6,373,247 | B1 | | 4/2002 | Marx et al. |
| 6,519,549 | B1 | * | 2/2003 | Lin et al. ..................... 702/151 |
| 6,559,638 | B1 | * | 5/2003 | Adelerhof .............. 324/207.21 |
| 6,566,867 | B1 | * | 5/2003 | Schroeder et al. ..... 324/207.22 |
| 6,578,437 | B1 | * | 6/2003 | Moerbe ................. 73/862.328 |
| 2002/0006017 | A1 | | 1/2002 | Adelerhof |
| 2002/0118013 | A1 | * | 8/2002 | Kowalski et al. ...... 324/207.15 |
| 2002/0149358 | A1 | | 10/2002 | Doescher |
| 2003/0056583 | A1 | * | 3/2003 | Schodlbauer et al. ......... 73/200 |
| 2003/0231098 | A1 | * | 12/2003 | Wan ........................ 338/32 H |

FOREIGN PATENT DOCUMENTS

| DE | 43 17 512 | 12/1994 |
| DE | 197 22 834 | 12/1998 |
| EP | 0 905 523 | 3/1999 |
| WO | 00/79298 | 12/2000 |

* cited by examiner

*Primary Examiner*—Bot LeDynh
(74) *Attorney, Agent, or Firm*—Kenyon & Kenyon LLP (57) ABSTRACT

A GMR sensor element is proposed, having a rotationally symmetrical positioning of especially eight GMR resistor elements which are connected to each other to form two Wheatstone's full bridges. This GMR sensor element is especially suitable for use in an angle sensor for the detection of the absolute position of the camshaft or the crankshaft in a motor vehicle, particularly in the case of a camshaft-free engine having electrical or electrohydraulic valve timing, of a motor position of an electrically commutated motor, or of detection of a windshield wiper position, or in the steering angle sensor system in motor vehicles.

12 Claims, 8 Drawing Sheets

GMR SENSOR ELEMENT AND ITS USE

This application is a national stage filing under 35 U.S.C. 371 of International Application No. PCT/DE03/02145, filed Jun. 27, 2003, which claims priority from German Application No. 102 34 347.0, filed Jul. 26, 2002, and German Application No. 102 57 253.4, filed Dec. 07, 2002, specifications of which are incorporated by reference herein.

FIELD OF THE INVENTION

The present invention relates to a GMR sensor element according to the main claim, as well as its use.

BACKGROUND INFORMATION

The giant magneto-resistive effect (GMR effect) may be utilized, in the form of so-called spin-valve structures ("spin-valves") for angular-position sensing. This is described, for example, in PCT International Publication No. WO 00/79298 or in European Published Patent Application No. 0 905 523 A2.

GMR spin-valves are made up in essence of two ferromagnetic thin films having a resulting magnetization $m_1$ or $m_2$, which are separated from each other by a nonmagnetic thin film lying in between. The electrical resistance $R(\alpha)$ of such a layer system then shows a cosine-type function of the angle $\alpha$ between the direction of magnetization $m_1$ and the direction of magnetization $m_2$ of the form:

$$R(\alpha) = \overline{R} - Q5 \cdot \Delta R_{GMR} \cdot \cos(\alpha)$$

In this context, the maximum relative resistance change $\Delta R_{GMR}/\overline{R}$ designates the GMR effect, and typically amounts to 5% to 10%. GMR spin-valve layer systems, by the way, are usually deposited with the aid of cathode sputtering of the respective materials, and then structured using customary photolithography methods and etching techniques.

What is essential for the intended spin-valve function is a rigid, at least approximately not changeable direction of magnetization $m_1$ of the first ferromagnetic layer, of the so-called reference layer (RL), because of a magnetic field, acting from outside on the layer system, that is to be detected particularly with regard to its direction and/or strength, and a direction of magnetization, $m_2$, of the second ferromagnetic layer, of the so-called free layer (FL) or detection layer, that orients itself slightly, at least approximately parallel to the outer magnetic field. In order to achieve both of these, on the one hand, the two ferromagnetic layers are magnetically decoupled by a sufficient thickness of the nonmagnetic intermediate layer, of the so-called nonmagnetic layer (NML), of typically a few nanometers, and the magnetization of the reference layer (RL) is fixed or "pinned", for instance, by an additional, directly adjacent antiferromagnetic layer, a so-called natural antiferromagnet (AF), and by its mutual magnetic coupling by exchange interaction.

Figure 1A:
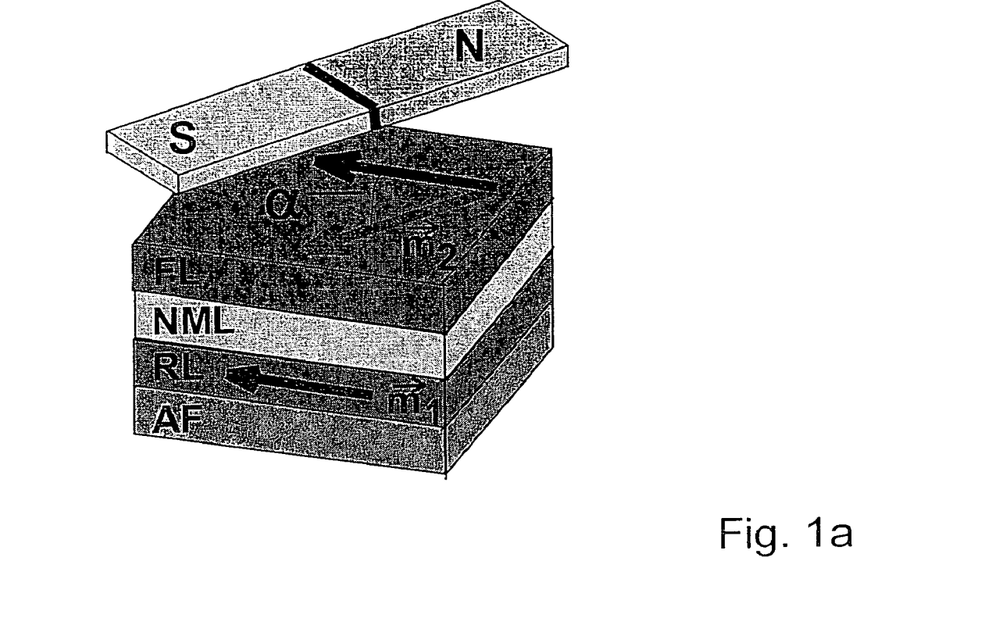
FIG. 1a shows a simplified GMR spin-valve layer construction having two ferromagnetic layers RL and FL that have magnetizations $m_1$ and $m_2$, one nonmagnetic intermediate layer NML and an antiferromagnetic layer AF. The latter is used for fixing (pinning) reference magnetization $m_1$. In addition, a magnetic transducer is provided for generating an outer magnetic field B. The angle α designates the angle between the field direction or magnetization direction of the free ferromagnetic layer (FL), and thus also the direction of the outer magnetic field B in the plane of the GMR sensor element, and the reference magnetization direction.
Figure 1B:
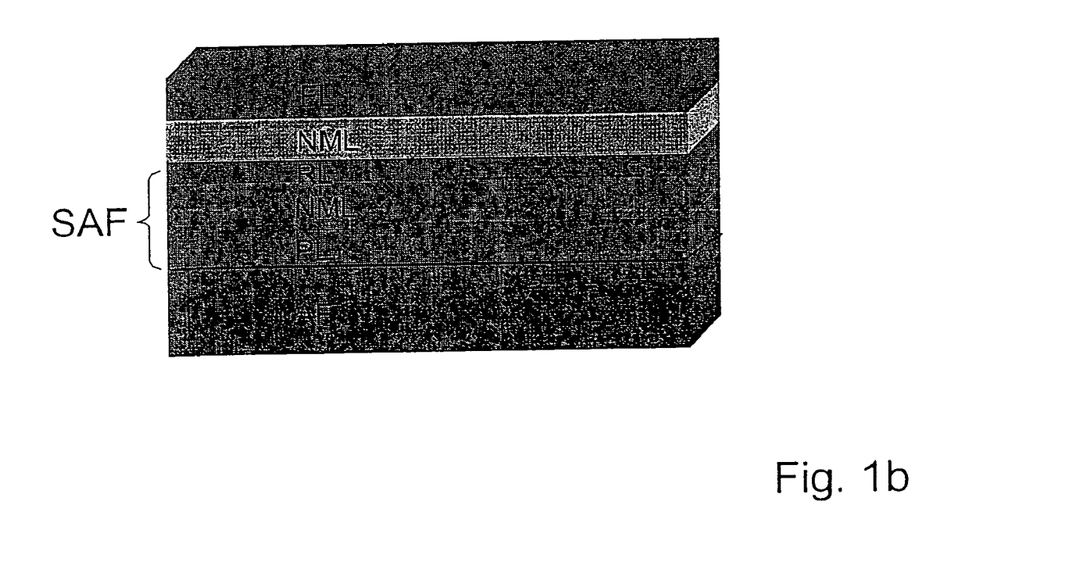
FIG. 1b shows a GMR spin-valve layer system having a natural antiferromagnet AF and an additional synthetic antiferromagnet SAF, as well as an additional nonmagnetic intermediate layer NML and a ferromagnetic free layer FL.

This is shown schematically in FIG. 1a, where the GMR layer system or GMR sensor element is under the influence of a magnetic field of a magnetic transducer. One may achieve a further improved stabilization of the reference magnetization by adding an additional so-called synthetic or "artificial" antiferromagnet (SAF). This SAF, corresponding to FIG. 1b, is made up of two ferromagnetic layers that is strongly antiferromagnetically coupled via a nonmagnetic intermediate layer. The ferromagnetic layer of these two, which lies directly next to or on the natural antiferromagnet AF, is designated as the pinned layer (PL), since its magnetization MR is fixed or "pinned" as a result of the coupling with the natural antiferromagnet (AF). The second ferromagnetic layer of the SAF, whose magnetization MR is oriented opposite to that of the pinned layer (PL) as a result of the antiferromagnetic coupling, is used as reference layer (RL) for the abovementioned GMR spin-valve layer system.

In order to extract the angle-dependent useful signal, in a GMR sensor element according to the related art, four spin-valve resistance elements are connected together to form a Wheatstone's bridge circuit (Wheatstone's full bridge), such as by using an aluminum thin film track conductor. The maximum signal amplitude is obtained by, as in FIG. 2, oppositely oriented reference magnetizations MR of the bridge resistors within the half bridges and similarly oriented reference magnetizations MR of the resistors lying diagonally in the full bridge.

Figure 2:
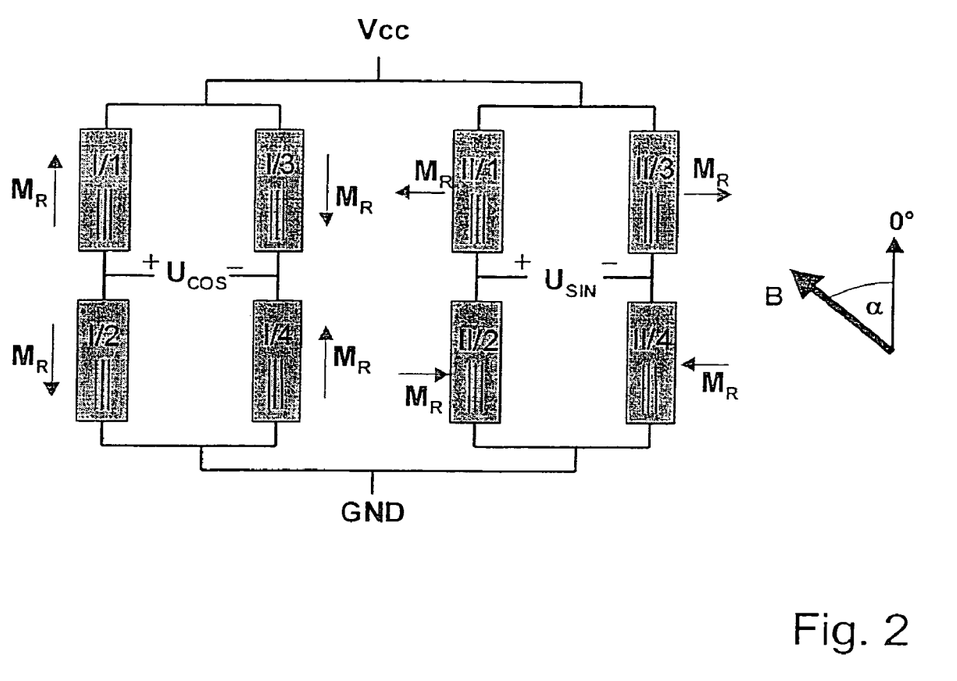
FIG. 2 shows an equivalent circuit diagram for an angle sensor element based on the GMR effect having two full bridges (Wheatstone's bridge circuits), the reference magnetization MR being oriented pairwise opposite within the two bridges, and being rotated from bridge to bridge by 90° with respect to each other. The direction of reference magnetization MR further is parallel or perpendicular to the direction of the individual, strip-shaped structured GMR resistor elements, which are constructed, for example, as in FIG. 1a or 1b. This "strip direction" is represented by the indicated strip set within the individual GMR resistor elements. Besides that, in FIG. 2 the direction of an outer magnetic field B is indicated, which, together with a reference direction, subtends the angle α that is is to be measured using the GMR sensor element. The reference direction or zero direction is, in this context, specified by the selection of the reference magnetization directions in the two full bridges, of which one is designed as a sine full bridge and one as a cosine full bridge.

As a rule, a GMR angle sensor also has a second full bridge of GMR resistors, whose reference directions, as shown in FIG. 2, are rotated by 90° to the ones of the first bridge. Signal $U_{sin}$ made available by the second full bridge is thereby phase-shifted by 90° with respect to the signal of the first full bridge $U_{cos}$.

By arctangent formation or corresponding algorithms (such as the CORDIC algorithm) one then determines, from the two cosine-shaped or sine-shaped bridge signals $U_{sin}$, $U_{cos}$, the angle $\alpha$, that is single-valued over a full 360° revolution, to the direction of an outer magnetic field B.

The different reference magnetization directions according to FIG. 2 are, for instance, implemented in that the individual GMR bridge resistors are heated locally to a temperature T above the blocking temperature (Néel temperature) of the antiferromagnetic layer (AF), but below the Curie temperature of ferromagnetic layers (PL, RL) as in FIG. 1a or 1b, so that the antiferromagnetic spin order in the antiferromagnetic layer is canceled, and thereafter they are cooled in an outer magnetic field of a suitable field direction. In the renewed formation, taking place in this context, of the antiferromagnetic order, the spin configuration resulting from the exchange interaction at the interface of antiferromagnetic layer (AF) and adjacent ferromagnetic layer (PL) is frozen. As a result, the direction of magnetization of the adjacent ferromagnetic layer (pinned layer PL) is fixed. The local heating of the GMR bridge resistors may take place, for example, with the aid of a brief laser pulse or current pulse. The current pulse may be driven, in this context, directly by the GMR conductor structure or/and an additional heating conductor.

In the case of known GMR angle sensors, reference magnetization MR of the individual bridge resistors is selected to be either parallel or perpendicular to the direction of the strip-shaped structured GMR resistor elements. This is used to hold the influence of the shape anisotropy to a low value. Furthermore, the strip-shaped structured GMR resistor elements are preferably aligned in parallel within a full bridge according to FIG. 2. This is used to suppress a signal contribution because of a superimposed anisotropic magnetoresistive effect (AMR effect). The AMR signal contribution is based, in this context, on a function of the electric resistance of the angle $\alpha$ between the current direction and the magnetization direction of the form:

$$R(\theta) = \overline{R} + Q5 \cdot \Delta R_{AMR} \cdot \cos(2 \cdot \theta)$$

If, on the other hand, the GMR resistors are implemented within a half bridge and having orthogonal alignment of their GMR strips, as is the case, for example, in FIG. 10 in PCT International Publication No. WO 00/79298, then the AMR signal contribution is even maximally favored. That acts in a worsening manner on the angular accuracy of the GMR angle sensor.

SUMMARY OF THE INVENTION

For the reasons mentioned, therefore, known GMR angle sensors have no rotationally symmetrical positioning of the bridge resistors. Rather, both full bridges are usually positioned laterally next to each other. Therefore, as a result of the lacking rotational symmetry, a heightened sensitivity of known sensors comes about with respect to the directional inhomogeneity of the transducer field, i.e. of the magnetic field acting from the outside, as well as with respect to temperature gradients.

Because, in known GMR angle sensors, the pinning direction or reference direction within a bridge resistor always has a fixed angle to the strip direction, these sensors do not further offer the possibility of compensating for shape anisotropy-conditioned influences on the pinning behavior and such disadvantages on the accuracy of the angular sensing.

By contrast, for an angular sensor that records over 360°, rotational symmetry in the sensor design is a great advantage, so that one does not obtain additional, direction-dependent angular error contributions, just because of an asymmetry in the positioning of the individual GMR resistor elements.

Therefore, because of the rotationally symmetrical positioning of the GMR resistor elements in the two Wheatstone's bridges, both a reduced sensitivity with respect to field direction inhomogeneities and temperature inhomogeneities is achieved and an undesired AMR signal contribution is suppressed, and, furthermore, the shape anisotropy influence on the pinning behavior and the angle sensing accuracy of the GMR sensor element is reduced. It is also especially advantageous if, besides the rotationally symmetrical positioning of the GMR resistor elements in the two Wheatstone's bridges, an interleaved positioning of the resistors with each other is selected. This leads to a further reduced sensitivity to field direction inhomogeneities and temperature inhomogeneities.

The suppression of the interfering AMR signal contribution is achieved by an additional subdivision of every single GMR bridge resistor element into two equal halves, or partial bridge resistors, having GMR strip directions that are oriented orthogonally to one another. This particularly also leads to an increase in angular measurement accuracy. It is also advantageous, in this connection, that, because the direction of the strip-shaped structured GMR resistor elements ("GMR strip direction") is selected for respectively one of the two partial bridge resistors to be parallel, and is selected for respectively the other of the partial bridge resistors to be perpendicular to the pinning direction or reference direction, an averaging comes about of the influence of pinning directions parallel and perpendicular to the strip direction within each of the GMR bridge resistor elements. The pinning behavior is then, in turn, identical for all two-part GMR bridge resistor elements (average of two parts, in each case). In this case, the two bridge output signals $U_1$, $U_2$ advantageously also have a 45° phase shift with respect to each other.

If the GMR resistor elements have a pinning direction or a reference direction which has been selected to be at least approximately less than 45° to the direction of the strip-shaped structured GMR resistor elements, this leads advantageously to an identical pinning behavior of the individual GMR resistor elements, i.e. especially to an improved signal stability and long-term stability of the GMR sensor element. In this case, the two bridge output signals $U_1$, $U_2$ also have a 45° phase shift with respect to each other.

Bridge output signals $U_1$, $U_2$, that are phase-shifted by any desired angle ν to each other, ν being preferably 45° or around 45°, may finally, advantageously, be imaged by a coordinate transformation to orthogonal signals having a 90° phase shift. From the latter, the angle α, being sought after, to the direction of outer magnetic field B may be determined, by arctangent formation or a corresponding algorithm, such as the CORDIC algorithm. Beyond this, the coordinate transformation offers the advantage that production-caused fluctuations in the phase difference of the two bridge signals $U_1$, $U_2$ are able to be adjusted during the imaging on the orthogonal signals.

BRIEF DESCRIPTION OF THE DRAWINGS

FIG. 3 shows a rotationally symmetrical device of meandering, interleaved GMR bridge resistor elements 1/1 to 1/4 (bridge 1) and 11/1 to 11/4 (bridge 11). In this context, the directions of the reference magnetization (see arrows marked in FIG. 3) in bridge 1 are in each case oriented at less than 45° to the direction of the individual strip-shaped structured GMR resistor elements, and the reference magnetization directions in bridge 11 are rotated in each case by 45° with respect to those in bridge 1. Besides that, in FIG. 3 the direction of an outer magnetic field B is indicated, which, together with a reference direction, subtends the angle α that is to be measured using the GMR sensor element. The reference direction or zero direction is, in this context, specified by the selection of the reference magnetization directions in bridge 1 and bridge 11, bridge 1 being supposed to supply a cosine-shaped signal curve over the angle α.

FIG. 4 shows an equivalent circuit diagram to the layout of the GMR sensor element according to FIG. 3. The pinning or reference magnetization direction MR is, in this context, in each case oriented at less than 45° to the GMR strip direction, which is, analogously to FIG. 2, once more indicated by the strip set drawn in inside the individual GMR resistor elements, and in bridge 11 is rotated additionally by 45° with respect to that in bridge 1. A strengthening of the AMR signal contribution comes about as a result of strip directions of the resistors of each half bridge that are orthogonal to one another.

FIG. 7 shows an equivalent circuit diagram to the GMR resistor elements as in FIG. 6. Suppression of the AMR signal contribution is here achieved by subdividing each bridge resistor element I/1, I/2 to II/4 into two halves a and b, having GMR strip directions that are orthogonal to one another. The respective pinning magnetization or reference magnetization MR is less than 45° to the respective GMR strip direction. The latter is indicated by the strip set drawn in within the individual GMR resistor elements.

DETAILED DESCRIPTION a.) Rotationally Symmetrical Positioning

Figure 3:
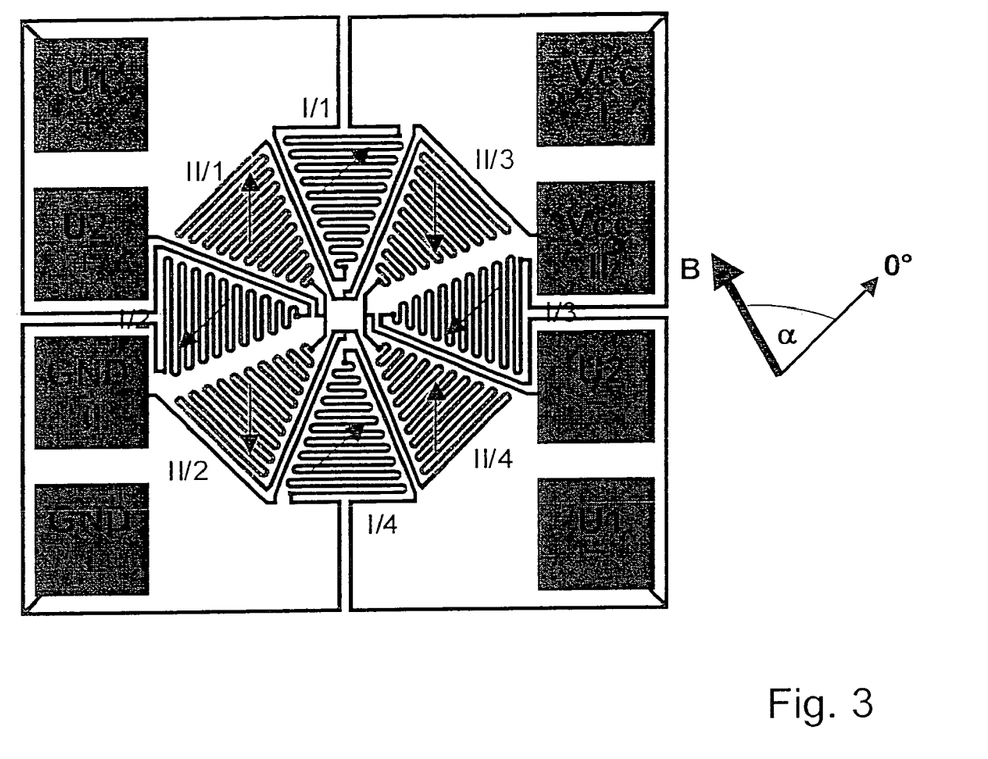
Figure 4:
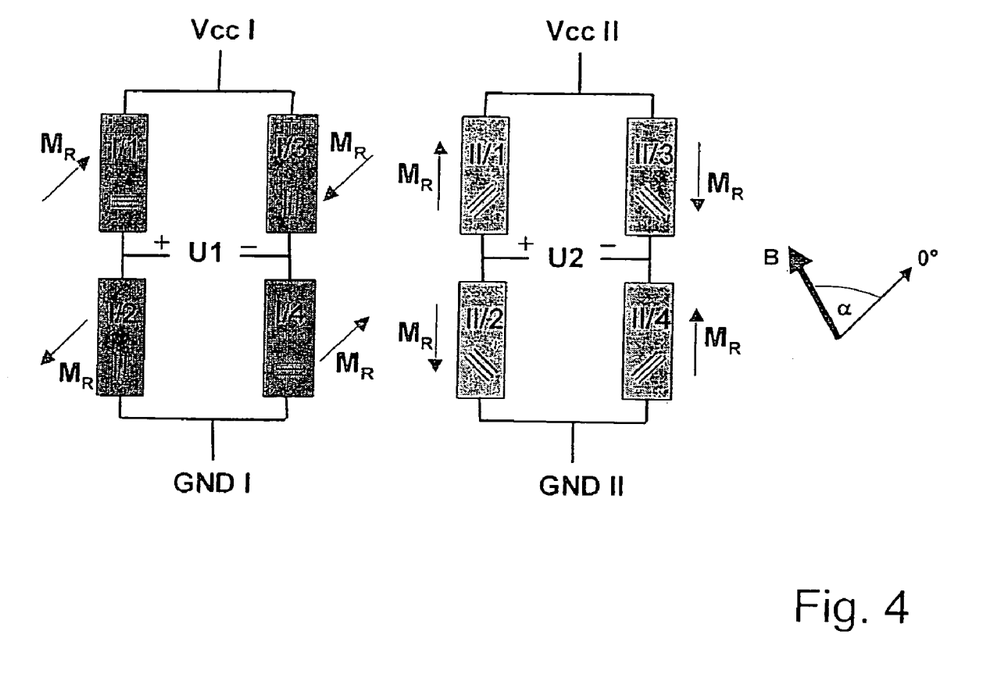

FIG. 3 shows a possible rotationally symmetrical positioning of altogether eight bridge resistor elements of two full bridges (Wheatstone's bridges). In contrast to AMR sensors, in which the reference direction is specified by the current direction which is specified by the strip direction, in the case of the GMR angle sensor, the reference direction is specified by the direction of the magnetization of reference layer (RL). In principle, the pinning direction or reference direction may, in this context, be selected as desired, however, in order to obtain the same pinning behavior for all bridge resistor elements, in this case an orientation of the pinning direction or reference direction is selected that is less than 45° to the strip direction. This is made even clearer in FIG. 4, where, besides the strip direction (strip set inside the resistor symbols) the direction of the reference magnetization MR is also given.

b.) Imaging on Orthogonal Signals

Figure 5A:
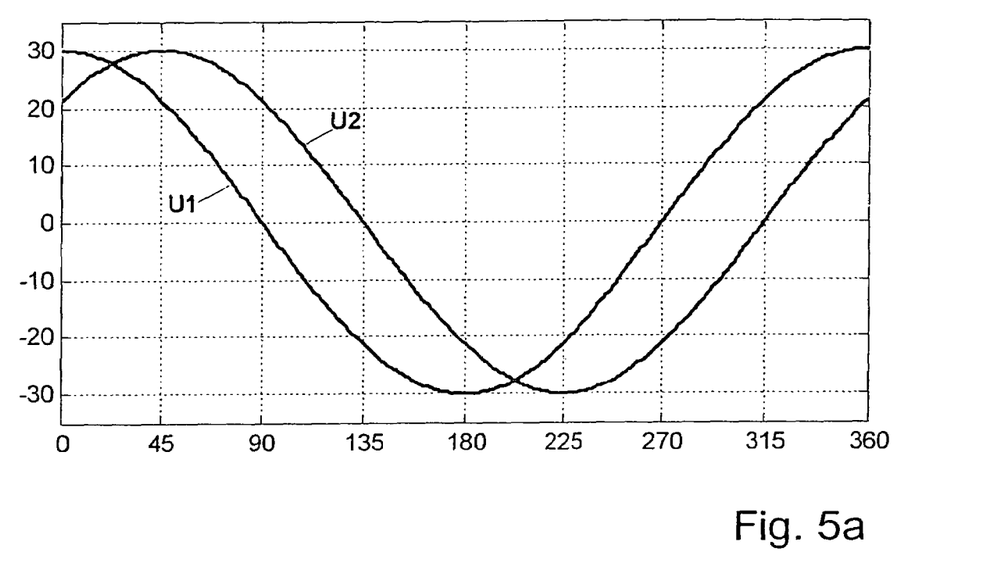
FIG. 5a shows GMR sensor output signals $U_1$ and $U_2$ having a 45° phase difference according to a pinning direction or reference magnetization direction MR less than 45° to the strip direction, corresponding to FIG. 3 and 4.
Figure 5B:
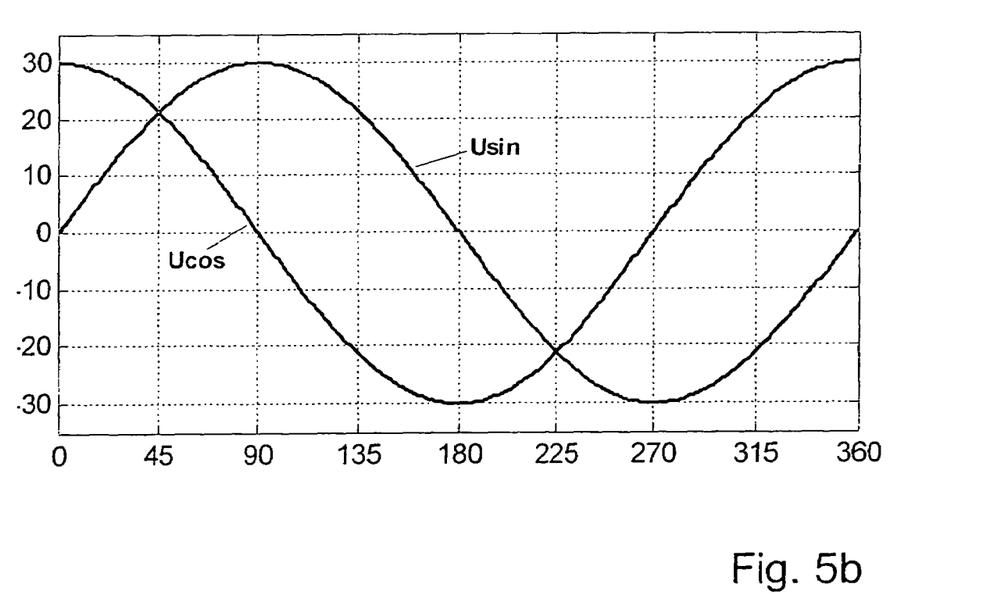
FIG. 5b shows correspondingly transformed GMR sensor signals $U_{cos}$ and $U_{sin}$ that are orthogonal to each other, having a 90° phase difference. The AMR signal contribution is not shown in FIG. 5a and FIG. 5b. The direction of outer magnetic field B in degrees, i.e. the angle α, is in each case plotted on the x axis in FIGS. 5a and 5b, while on the y axis there is plotted, in FIG. 5a the GMR sensor output signal in mVolt/Volt, and in FIG. 5b the transformed GMR sensor signal in mVolt/Volt.

In the case of a pinning direction or a direction of the reference magnetization less than 45° to the GMR strip direction, according to FIG. 5a the two bridge output signals $U_1$ and $U_2$ do not have the usual phase shift of 90°, but only a phase shift of 45°. These signals $U_1$ and $U_2$ may, however, be transformed in a simple manner to the orthogonal, cosine-shaped and sine-shaped signals according to FIG. 5b. To do this, the following transformation is performed in a sensor evaluation electronic device:

$$\begin{pmatrix} U_{\cos} \\ U_{\sin} \end{pmatrix} = \begin{bmatrix} 1 & 0 \\ \frac{\cos(\varphi)}{\sin(\varphi)} & \frac{-1}{\sin(\varphi)} \end{bmatrix} \cdot \begin{pmatrix} U_1 \\ U_2 \end{pmatrix} = \begin{pmatrix} U_1 \\ \frac{U_1 \cdot \cos(\varphi) - U_2}{\sin(\varphi)} \end{pmatrix}$$

In this equation, ν denotes the phase shift of the second bridge signal with respect to the first bridge signal. This phase shift may, in principle, be selected as desired, but preferably a phase shift of 45° is set.

From the cosine-shaped and sine-shaped signals obtained with the aid of this transformation, according to FIG. 5b, one may determine the angle α by arctangent formation or by applying a corresponding algorithm, such as the CORDIC algorithm in the sensor electronic system:

$$\alpha_{mess} = \arctan\left(\frac{U_{\sin}}{U_{\cos}}\right)$$

Figure 6:
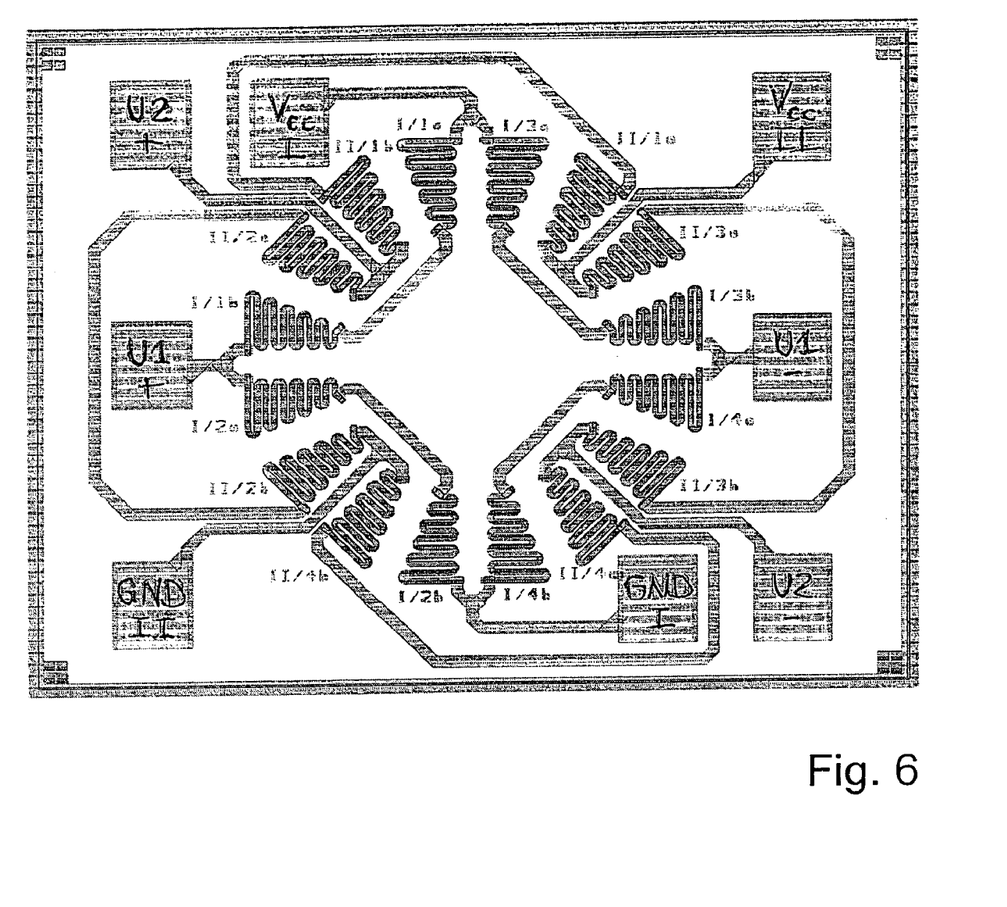
FIG. 6 shows a rotationally symmetrical, at least approximately circular or octagonal, interleaved positioning of meandering GMR bridge resistor elements, a suppression of the AMR signal contribution having been undertaken by subdividing each of the individual bridge resistor elements into two equal halves having strip directions that are orthogonal to one another.

The implementation of this coordinate transformation further offers the important advantage that production-conditioned fluctuations in the phase shift of the two bridge signals $U_1$, $U_2$ are able to be detected specifically as to the sensor during imaging to the orthogonal signal (90° phase shift) and compensated for. To do this, for example in an offset adjustment or amplitude adjustment of the signals $U_1$, $U_2$ at the end of a production line, this phase shift ν is also determined, for example, using Fourier analysis of the two bridge signals $U_1$, $U_2$, and is stored in the sensor evaluation electronic system.

c.) Rotationally Symmetrical Positioning Having Suppression of the AMR Signal Contribution The resistor positioning shown in FIG. 3 favors the AMR signal contribution, since the GMR strip directions of the two bridge resistors of each half bridge are orthogonal to each other. This disadvantage may be avoided in that, according to the preferred, also rotationally symmetrical positioning according to FIG. 6, one puts together each bridge resistor from two equal halves having GMR strip directions that are perpendicular to each other. Because of the series connection of the two partial resistors each having identical reference magnetization MR, the AMR component is then filtered out, while the GMR signal component remains unchanged as a result of the identical direction of reference magnetization MR in the case of both partial resistors. This situation is made clearer by the following relationship for a two-part GMR bridge resistor element:

$$R(\alpha) = \underbrace{\frac{1}{2} \cdot (\overline{R} - 0.5 \cdot \Delta R_{GMR} \cdot \cos(\alpha) + 0.5 \cdot \Delta R_{AMR} \cdot \cos(2\vartheta))}_{1 \text{Teilwiderstand}} +$$

$$\underbrace{\frac{1}{2} \cdot (\overline{R} - 0.5 \cdot \Delta R_{GMR} \cdot \cos(\alpha) + 0.5 \cdot \Delta R_{AMR} \cdot \cos(2(\vartheta - 90°)))}_{2 \text{Teilwiderstand}}$$

$$= \overline{R} - 0.5 \cdot \Delta R_{GMR} \cdot \cos(\alpha)$$

In this equation, $\alpha$ denotes the angle between field direction and magnetization direction of the free ferromagnetic layer (FL) and the reference magnetization direction; $\theta$ denotes the angle between the field direction or magnetization direction of the free layer (FL) and the GMR strip direction of the first partial resistor. The strip direction of the second partial resistor is rotated by −90° with respect to the first partial resistor.

d.) Pinning Behavior

Figure 7:
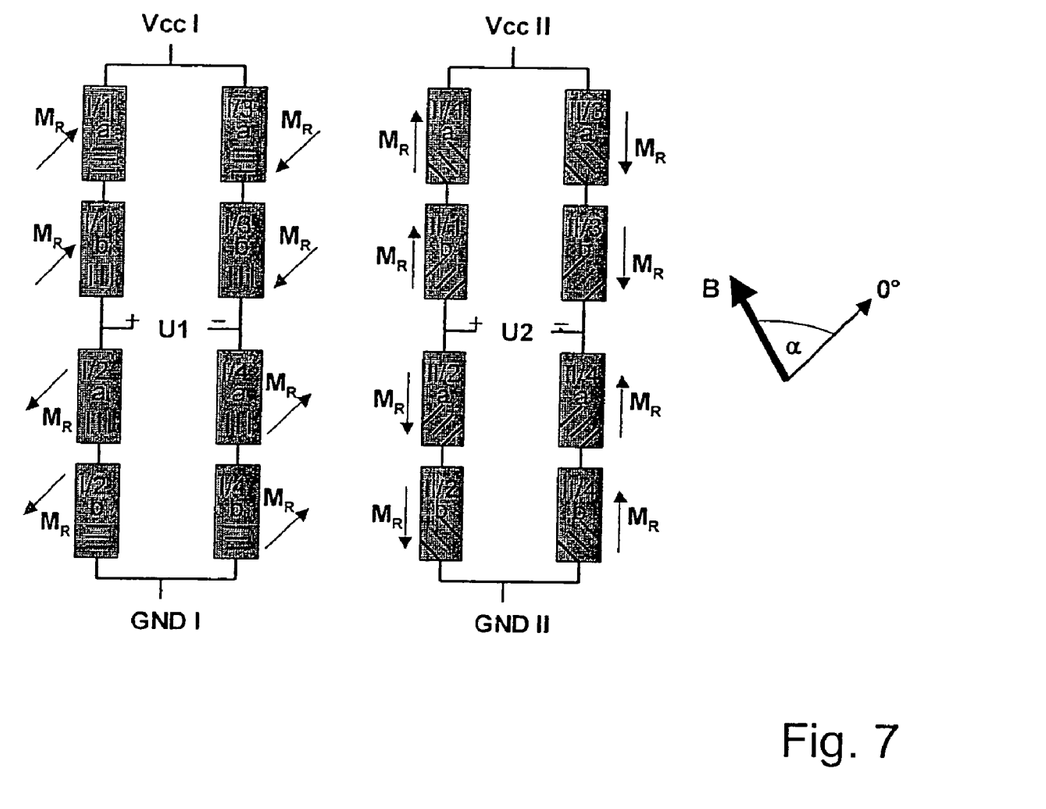

FIG. 7 makes clear the subdivision of the bridge resistors into two halves in each case, having strip directions that are orthogonal to each other, but having an identical reference magnetization direction MR. In principle, the pinning direction and the direction of reference magnetization MR may be selected as desired. However, an angle of 45° to the respective strip direction is preferred, because thereby an identical pinning behavior is achieved for all partial resistors.

Figure 8:
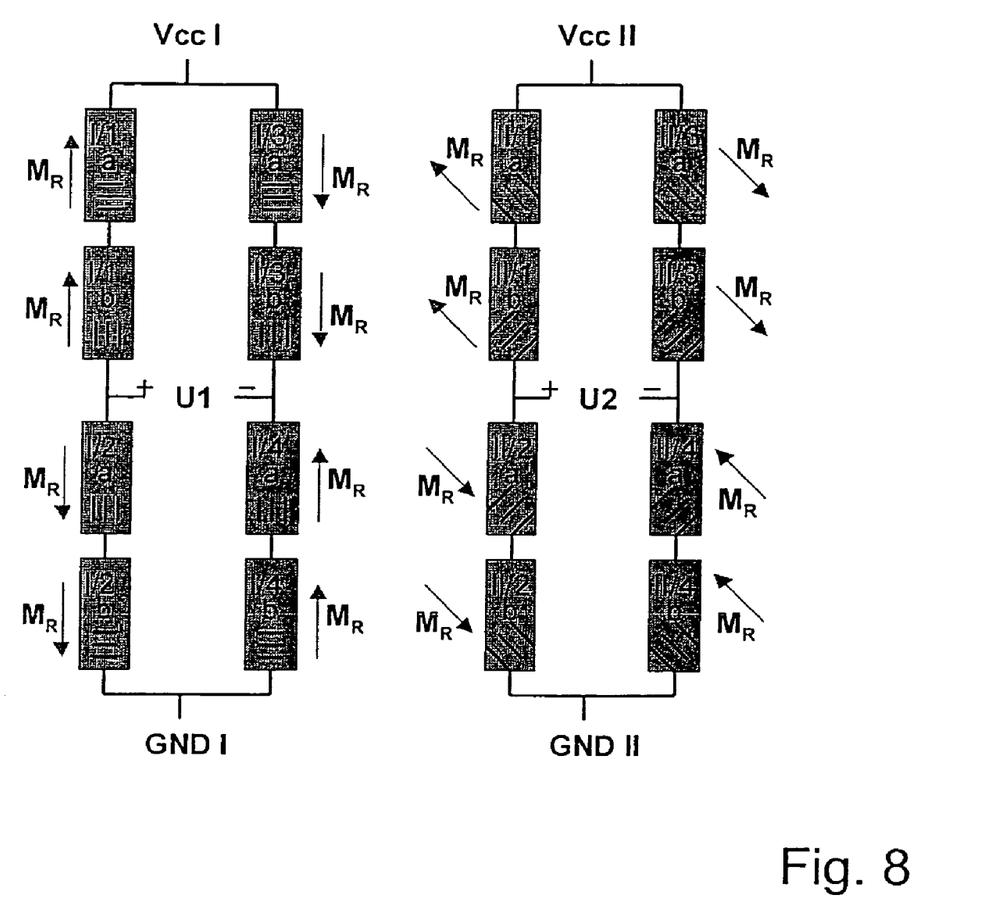
FIG. 8 shows an equivalent circuit diagram to the layout of the GMR resistor elements according to FIG. 6, having pinning magnetization directions or reference magnetization directions MR, alternative to FIG. 7, of less than 0° and 90° to the GMR strip direction at each of the individual bridge resistors I/1, I/2 to I/4. The averaging of the influence of the pinning direction takes place here by pinning direction or reference magnetization direction, both parallel and perpendicular to the GMR strip direction, within each two-part bridge resistor I/1, I/2 to I/4.

Alternatively, one may also set a pinning direction or a direction of reference magnetization MR which is oriented respectively parallel to the strip direction for one of the two partial resistors and respectively perpendicular to the strip direction for the other of the two partial resistors. It is true that thereby one achieves a different pinning behavior in the case of the individual partial resistors, however, overall again an identical pinning behavior is achieved in the case of each of the bridge resistor elements in the form of a series connection of the two partial resistors.

Compared to known sensors, this selection of the pinning direction or reference magnetization direction yields the advantage that, inside each bridge resistor element, via the different pinning behavior of parallel and perpendicular alignment of the pinning direction or the reference magnetization direction to the GMR strip direction, an average value comes about.

The 360° GMR angle sensor described is especially suitable for the detection of the absolute position of the camshaft or the crankshaft in a motor vehicle, particularly in the case of a camshaft-free engine having electrical or electrohydraulic valve timing, of a motor position of an electrically commutated motor, or of detection of a windshield wiper position, or in the steering angle sensor system in motor vehicles.

What is claimed is:

1. A GMR sensor element, comprising:
eight GMR resistor elements arranged in a rotationally symmetrical positioning and connected to each other to form two Wheatstone full bridges, wherein the GMR resistor elements are structured in strip form and are oriented with respect to one another such that a line coplanar to the GMR sensor element, passing approximately through a center of a circle or octagon formed by the eight GMR resistor elements, and bisecting any of the GMR resistor elements is approximately perpendicular to a strip direction of the bisected GMR resistor element.

2. The GMR sensor element as recited in claim 1, wherein the GMR resistor elements are interleaved.

3. A GMR sensor element, comprising:
eight GMR resistor elements arranged in a rotationally symmetrical positioning and connected to each other to form two Wheatstone full bridges, wherein each GMR resistor element of the Wheatstone full bridges is subdivided into two equally constructed halves having directions, of the GMR resistor elements that are structured in strip form, that are orthogonal to each other.

4. The GMR sensor element as recited in claim 1, wherein the GMR sensor element performs a determinate measurement of an angle of an outer magnetic field with respect to a magnetization of a reference layer over 360°.

5. The GMR sensor element as recited in claim 1, wherein the GMR resistor elements are situated at least approximately in one of circular fashion and octagonally.

6. A method of using a GMR sensor element including eight GMR resistor elements arranged in a rotationally symmetrical positioning connected to each other to form two Wheatstone full bridges, structured in strip form and oriented with respect to one another such that a line coplanar to the GMR sensor element, passing approximately through a center of a circle or octagon formed by the eight GMR resistor elements, and bisecting any of the GMR resistor elements is approximately perpendicular to a strip direction of the bisected GMR resistor element, the method comprising one of:
using the GMR sensor element in an angle sensor for detecting an absolute position of one of:
one of a camshaft and a crankshaft in a motor vehicle in a camshaft free engine having one of electrical and electrohydraulic valve timing,
a motor position of an electrically commutated motor, and
of a windshield wiper position; and
using the GMR sensor element in a steering angle sensor system in a motor vehicle.

7. The GMR sensor element as recited in claim 1, wherein the eight GMR resistor elements are arranged in a rotationally symmetrical positioning about a common center.

8. The GMR sensor element as recited in claim 1, wherein the eight GMR resistor elements are circularly positioned.

9. The method as recited in claim 6, wherein the eight GMR resistor elements are arranged in a rotationally symmetrical positioning about a common center.

10. The method as recited in claim 6, wherein the eight GMR resistor elements are circularly positioned.

11. The GMR sensor element as recited in claim 1, wherein the eight GMR resistor elements have one reference magnetization direction each and one strip direction each, and the reference magnetization direction of each GMR resistor element is oriented at an angle of less than 45° to the respective strip direction.

12. The method as recited in claim 6, wherein the eight GMR resistor elements have one reference magnetization direction each and one strip direction each, and the reference magnetization direction of each GMR resistor element is oriented at an angle of less than 45° to the respective strip direction.

* * * * *